United States Patent
Terro et al.

(10) Patent No.: US 12,074,543 B2
(45) Date of Patent: Aug. 27, 2024

(54) EQUIPMENT AND METHOD FOR ESTIMATING A MOTOR PARAMETER

(71) Applicant: Knorr-Bremse Systeme Fuer Nutzfahrzeuge GmbH, Munich (DE)

(72) Inventors: Ali Terro, Munich (DE); Kai-Sven Becker, Schwieberdingen (DE); Zeger Bontinck, Muehlacker (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 328 days.

(21) Appl. No.: 17/764,823

(22) PCT Filed: Oct. 6, 2020

(86) PCT No.: PCT/EP2020/077928
§ 371 (c)(1),
(2) Date: Mar. 29, 2022

(87) PCT Pub. No.: WO2021/073936
PCT Pub. Date: Apr. 22, 2021

(65) Prior Publication Data
US 2022/0329191 A1    Oct. 13, 2022

(30) Foreign Application Priority Data

Oct. 15, 2019 (EP) .................................... 19203430

(51) Int. Cl.
*G01R 31/3187* (2006.01)
*G01R 31/34* (2020.01)
(Continued)

(52) U.S. Cl.
CPC ............ *H02P 23/14* (2013.01); *G01R 31/343* (2013.01); *H02P 29/60* (2016.02)

(58) Field of Classification Search
CPC ....... H02P 23/14; H02P 29/60; G01R 31/343; G01R 31/006; G01R 31/2829; G01R 31/3187
See application file for complete search history.

(56) References Cited

U.S. PATENT DOCUMENTS

| | | | |
|---|---|---|---|
| 9,543,879 B2* | 1/2017 | Toliyat | H02P 29/0241 |
| 2015/0300151 A1* | 10/2015 | Mohaghegh | E21B 47/07 702/9 |
| 2018/0019693 A1* | 1/2018 | Suzuki | H02P 25/022 |

FOREIGN PATENT DOCUMENTS

| | | |
|---|---|---|
| CN | 107590323 A | 1/2018 |
| CN | 108964556 A | 12/2018 |

(Continued)

OTHER PUBLICATIONS

Kivanc, O.C. et al., "Electro-hydraulic power steering system modelling for parameter fault detection based on model reference adaptive frame", IECON 2016—42nd Annual Conference of the IEEE Industrial Electronics Society, IEEE, Oct. 23, 2016, pp. 1808-1814.

(Continued)

*Primary Examiner* — Jermele M Hollington
*Assistant Examiner* — Taqi R Nasir
(74) *Attorney, Agent, or Firm* — NORTON ROSE FULBRIGHT US LLP; Gerard A. Messina

(57) ABSTRACT

A method and equipment (apparatus) for estimating motor parameters includes: receiving an operating parameter of an electric motor, estimating an estimated first motor parameter based on the operating parameter and on an initially determined second motor parameter and estimating an estimated second motor parameter based on the operating parameter and on an initially determined first motor parameter. The equipment (apparatus) and the method further include estimating a revised estimated second motor parameter based on (Continued)

the estimated first motor parameter and on the operating parameter, and estimating a revised estimated first motor parameter based on the estimated second motor parameter and on the operating parameter.

13 Claims, 2 Drawing Sheets

(51) Int. Cl.
*H02P 23/14* (2006.01)
*H02P 29/60* (2016.01)

(56) References Cited

FOREIGN PATENT DOCUMENTS

| | | | |
|---|---|---|---|
| EP | 2182620 | A1 | 5/2010 |
| JP | 2010110141 | A | 5/2010 |
| JP | 2012170251 | A | 9/2012 |
| JP | 2018011403 | A | 1/2018 |

OTHER PUBLICATIONS

Jiang, Xiaoliang et al., "Modeling and simulation of parameter identification for PMSM based on EKF", Computer, Mechatronics, Control and Electronic Engineering (CMCE), 2010 International Conference ON, IEEE, USA, Aug. 24, 2010, pp. 345-348.
Cai, Jun et al., "Rotor position estimation of high-speed SRM drive using neural networks", Electrical Machines and Systems, 2009, ICEMS 2009, International Confernece ON, IEEE, Piscataway, NJ, USA, Nov. 15, 2009, pp. 1-5.
Choi, Sungmin et al., "Torque Error Reduction of Interior Permanent Magnet Synchronous Motor Drives using a Stator Flux Linkage Observer", 2019 International Aegean Conference on Electrical Machines and Power Electronics (ACEMP) & 2019 International Conference on Optimization of Electrical and Electronic Equipment (OPTIM), IEEE, Aug. 27, 2019, pp. 280-285.
International Search Report dated Nov. 18, 2020 for PCT/EP2020/077928.

* cited by examiner

EQUIPMENT AND METHOD FOR ESTIMATING A MOTOR PARAMETER

FIELD OF THE INVENTION

The present invention relates to an equipment and a method for estimating a motor parameter, in particular, for online estimating a motor parameter of electric motors.

BACKGROUND INFORMATION

An online estimation of motor parameters enables a condition monitoring of an electric motor such as an estimation of phase failures or an estimation of a coil temperature.

In particular, for the coil temperature estimation, an accurate estimation of a phase resistance $R_S$ is necessary. However, an estimation of the phase resistance $R_S$ depends on a value of a permanent magnet flux linkage $\Psi_{PM}$. Moreover, during load or speed changes, an existence of non-modeled voltage losses causes deviations in the estimated phase resistance $R_S$.

A "Model Reference Adaptive Controller (MRAC)" and an "Adaline Neural Network (ANN)" are believed to be known parameter estimation algorithms. In particular, the MRCA algorithm can be used for estimating the phase resistance $R_S$ and the ANN algorithm can be used for estimating the permanent magnet flux linkage $\Psi_{PM}$ so that an algorithm combining these two algorithms appears suitable for requested estimation.

However, due to a rank deficiency, a simultaneous estimation of the permanent magnet flux linkage $\Psi_{PM}$ and of the phase resistance $R_S$ is impossible under reference control so that a direct current is set to zero ($I_d$=0 A). Therefore, in a MRCA model, the permanent magnet flux linkage $\Psi_{PM}$ is set to a constant value to estimate the phase resistance $R_S$ and, in an ANN model, the phase resistance $R_S$ is set to a constant value to estimate the permanent magnet flux linkage $\Psi_{PM}$. However, these models do not account for the non-modeled voltage losses during load and speed changes and, therefore, deviations in the estimated parameters from their actual values are caused. However, these deviations cause errors in the coil temperature estimation.

SUMMARY OF THE INVENTION

Therefore, an object underlying the invention is to remedy the above disadvantages and to provide an equipment and a method which enables an accurate estimation of motor parameters on occurring operating conditions.

The object may be achieved by an equipment according to the description herein, a method according to the description herein, and a computer program product according to the description herein. Advantageous further developments are included in the further descriptions herein.

According to an aspect of the invention, an equipment for estimating motor parameters comprises an input interface configured to receive an operating parameter of a motor, a first device configured to perform a first parameter estimation algorithm estimating an estimated first motor parameter based on the operating parameter and on an initially determined second motor parameter, and a second device configured to perform a second parameter estimation algorithm estimating an estimated second motor parameter based on the operating parameter and on an initially determined first motor parameter. The equipment further comprises a third device configured to perform a third parameter estimation algorithm estimating a revised estimated second motor parameter based on the estimated first motor parameter and on the operating parameter, and a fourth device configured to perform a fourth parameter estimation algorithm estimating a revised estimated first motor parameter based on the estimated second motor parameter and on the operating parameter.

By such an equipment, an influence of a non-modeled operating parameter can be considered in order to provide a more exact estimate of the motor parameters.

In an advantageous implementation of the equipment, the operating parameter comprises at least one of a detected voltage, a detected current, and a detected electrical speed, the first motor parameter comprises a permanent magnet flux linkage, and the second motor parameter comprises a phase resistance.

By the selection of these operating parameters and motor parameters to be estimated, an estimation of the motor parameters necessary for estimating a coil temperature can be accurately performed.

In a further advantageous implementation of the equipment, the first device and the fourth device comprise an artificial neuronal network model performing the parameter estimation algorithm, and the second device and the third device comprise a Model-Reference-Adaptive-Control model performing the second and third parameter estimation algorithm.

By the provision of the respective parameter estimation algorithm for the estimation of the motor parameters, suitable parameter estimation algorithm are provided and an accurate and effective estimation of the motor parameters is possible.

In another advantageous implementation of the equipment, the initially determined first motor parameter and the initially determined second motor parameter are constant values.

By this determination, suitable start values for the estimation are provided.

In yet another advantageous implementation of the equipment, the third or fourth device is configured to estimate a third motor parameter.

By the estimation of a further parameter in a more accurate manner, the estimation of the coil temperature can be improved or an estimation of further parameters is possible.

In still another advantageous implementation of the equipment, the third motor parameter comprises an inductance.

By the estimation of the inductance, failure of a coil can be determined.

According to another aspect of the invention, a method comprises the steps: estimating an estimated first motor parameter based on an operating parameter and on the initially determined second motor parameter, estimating the estimated second motor parameter based on the operating parameter and on the initially determined first motor parameter, estimating the revised estimated second motor parameter based on the estimated first motor parameter and on the operating parameter, and estimating the revised estimated first motor parameter based on the estimated second motor parameter and on the operating parameter.

By such a method, the influence of the non-modeled operating parameter can be considered in order to provide a more exact estimate of the motor parameters.

In an advantageous implementation of the method, the operating parameter comprises a detected voltage, a detected current and a detected electrical speed, the first motor parameter comprises a phase resistance, and the second motor parameter comprises a permanent magnet flux linkage.

By the selection of these operating parameters and motor parameters in the method, an estimation of the motor parameters necessary for estimating the coil temperature can be accurately performed.

In another advantageous implementation of the method, the estimate of the estimated first motor parameter and of the revised estimated first motor parameter are performed by the artificial neuronal network model, and the estimate of the estimated second motor parameter and of the revised estimated second motor parameter are performed by the model reference adaptive control model.

By the use of the respective parameter estimation algorithm for the estimation of the motor parameters, suitable parameter estimation algorithm are used and an accurate and effective estimation of the motor parameters is possible.

In a further advantageous implementation of the method, the initially determined first motor parameter and the initially determined second motor parameter are set as constant values.

By this determination, suitable start values for the estimation are used.

In yet another advantageous implementation, the method further comprising the step: estimating the third motor parameter.

By the estimation of the further motor parameter, the estimation of the coil temperature can be improved or the estimation of further motor parameters is possible.

According to a further advantageous implementation, the third motor parameter comprises the inductance.

According to a further aspect, a computer program product comprises instructions which, when the program is executed by a computer, cause the computer to carry out the steps of the method.

By the estimation of the inductance, the failure of a coil can be determined.

Below, the invention is elucidated by embodiments referring to the attached drawings.

DETAILED DESCRIPTION

Figure 1:
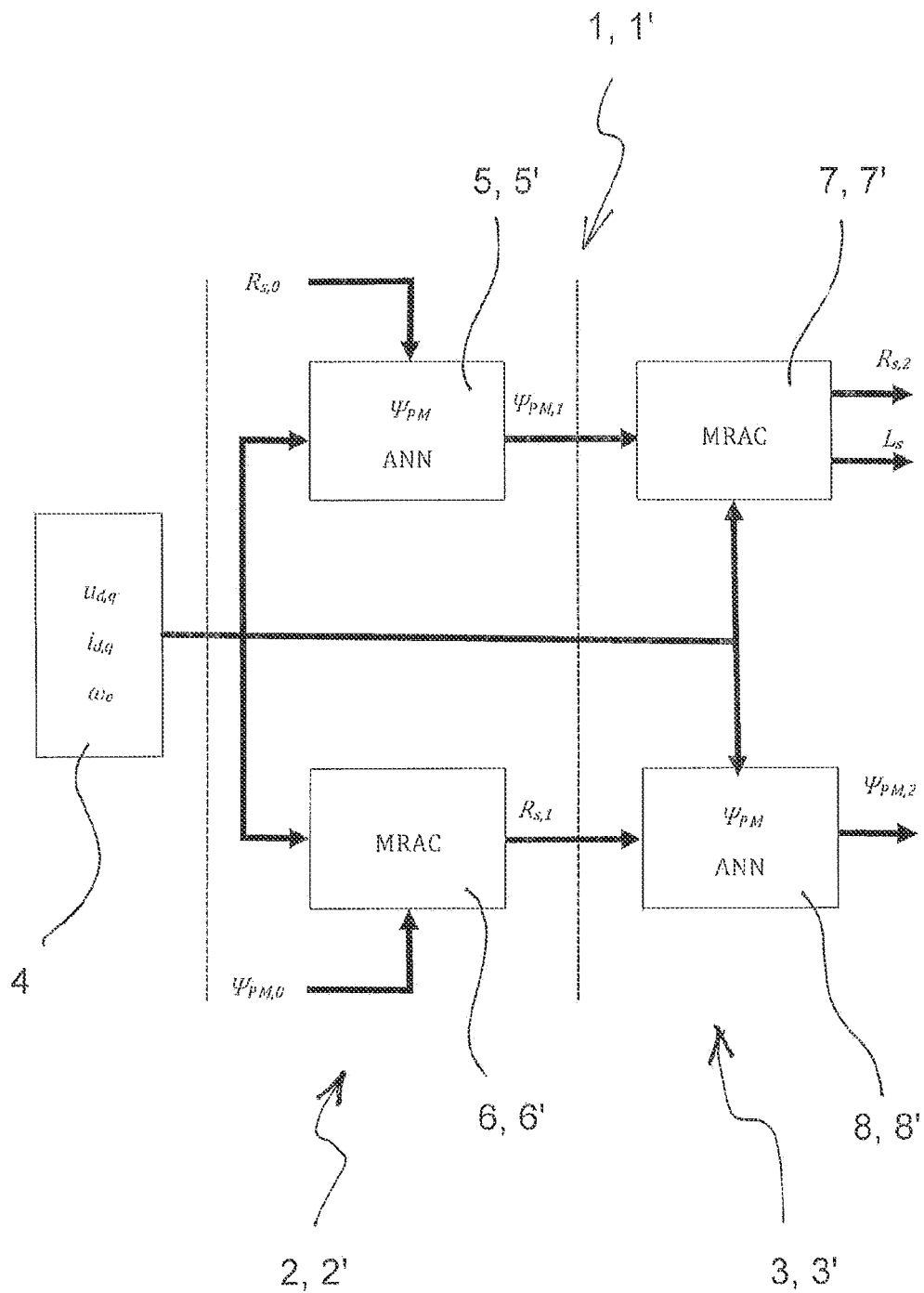
FIG. 1 shows a block diagram of an equipment and of an algorithm according to the invention.

FIG. 1 shows a block diagram of an equipment and of an algorithm according to the invention.

In the embodiment provided as an equipment, reference sign 1 depicts an equipment for estimating a motor parameter of an electric motor (not shown).

A first motor parameter comprises a permanent magnet flux linkage $\Psi_{PM}$. A second motor parameter comprises a phase resistance $R_s$. Alternatively, other motor parameters can be estimated.

The equipment 1 comprises a first estimator 2 and a second estimator 3. Furthermore, the equipment 1 comprises an input interface 4.

The input interface 4 receives operating parameters of the electric motor. The input interface 4 receives a detected voltage $u_{d,q}$, a detected current $i_{d,q}$, and a detected electrical speed We. In alternative embodiments, not all of these operating parameters or additional operating parameters are input.

The first estimator 2 comprises a first device 5 comprising an artificial neuronal network (ANN) model and a second device 6 comprising a model reference adaptive control (MRAC) model respectively performing a parameter estimation algorithm. Alternatively, another quantity of the devices, only one or more than two, or another kind of models, e.g. an Extended-Kalman-Filter (EKF), can be provided.

The first device 5 is configured to perform a first parameter estimation algorithm according to the artificial neuronal network (ANN) model estimating an estimated first motor parameter $\Psi_{PM,1}$ based on the operating parameters $u_{d,q}$, $i_{d,q}$, $\omega_e$ and on an initially determined second motor parameter $R_{s,0}$.

The second device 6 is configured to perform a second parameter estimation algorithm according to the model reference adaptive control (MRAC) model estimating an estimated second motor parameter $R_{s,1}$ based on the operating parameters $u_{d,q}$, $i_{d,q}$, $\omega_e$ and on an initially determined first motor parameter $\Psi_{PM,0}$.

The second estimator 3 comprises a third device 7 comprising the model reference adaptive control (MRAC) model and a fourth device 8 comprising the artificial neuronal network (ANN) model respectively performing a parameter estimation algorithm. Alternatively, another quantity of the devices, only one or more than two, or another kind of models, e.g. a concurrent learning adaptive control, can be provided.

The third device 7 is configured to perform a third parameter estimation algorithm according to the model reference adaptive control (MRAC) model estimating a revised estimated second motor parameter $R_{s,2}$ based on the estimated first motor parameter $\Psi_{PM,1}$ and on the operating parameters $u_{d,q}$, $i_{d,q}$, $\omega_e$.

The third device 7 further estimates a third motor parameter $L_s$. The third motor parameter comprises an inductance. Alternatively, another third motor parameter is estimated or no third motor parameter is estimated.

The fourth device 8 is configured to perform a fourth parameter estimation algorithm according to the artificial neuronal network (ANN) model estimating a revised estimated first motor parameter $\Psi_{PM,2}$ based on the estimated second motor parameter $R_{s,1}$ and on the operating parameters $u_{d,q}$, $i_{d,q}$, $\omega_e$.

The initially determined first motor parameter $\Psi_{PM,0}$ and the initially determined second motor parameter $R_{s,0}$ are constant values. Alternatively, the initially determined motor parameters are variable values.

The estimators 2, 3 and the devices 5, 6, 7, 8 are illustrated as separate modules, nevertheless, alternatively, they can, entirely or partly, be integrated in one or several modules.

In the embodiment provided as a method, reference sign 1' depicts a method for estimating a motor parameter of an electric motor.

In use, the method for estimating a motor parameter 1' inputs the operating parameters $u_{d,q}$, $i_{d,q}$, $\omega$. Further, the initially determined second motor parameter $R_{s,0}$ and the initially determined first motor parameter $\Psi_{PM,0}$ are set.

Based on the operating parameters $u_{d,q}$, $i_{d,q}$, $\omega_e$ and the initially determined second motor parameter $R_{s,0}$, the first estimated motor parameter $\Psi_{PM,1}$ is estimated by a first parameter estimation algorithm 5'. Further, based on the operating parameters $u_{d,q}$, $i_{d,q}$, $\omega_e$ and the initially determined first motor parameter $\Psi_{PM,0}$, the estimated second motor parameter $R_{s,1}$ is estimated by a second parameter estimation algorithm 6'.

Furthermore, based on the operating parameters $u_{d,q}$, $i_{d,q}$, $\omega_e$ and the first estimated motor parameter $\Psi_{PM,1}$, the revised estimated second motor parameter $R_{s,2}$ is estimated by a third parameter estimation algorithm 7'. Moreover, based on the operating parameters $u_{d,q}$, $i_{d,q}$, $\omega_e$ and the estimated second motor parameter $R_{s,1}$, the revised estimated first motor parameter $\Psi_{PM,2}$ is estimated by the fourth parameter estimation algorithm 8'.

The first parameter estimation algorithm 5' and the second parameter estimation algorithm 6' are components of the first estimator 2' which denotes a device as well as a software module. The third parameter estimation algorithm 7' and the fourth parameter estimation algorithm 8' are components of the first estimator 3' which also denotes a device as well as a software module.

As mentioned above, the first motor parameter comprises the permanent magnet flux linkage $\Psi_{PM}$ and the second motor parameter comprises the phase resistance $R_s$. Alternatively, other motor parameters can be estimated.

The estimate of the estimated first motor parameter $\Psi_{PM,1}$ and of the revised estimated first motor parameter $\Psi_{PM,2}$ are performed by the artificial neuronal network (ANN) model and the estimate of the estimated second motor parameter $R_{s,1}$ and of the revised estimated second motor parameter $R_{s,2}$ are performed by a model reference adaptive control (MRAC) model. As also mentioned above, the estimates can be performed by only one kind of models or by another kind of models, e.g. a concurrent learning adaptive control.

The initially determined first motor parameter $\Psi_{PM,0}$ and the initially determined second motor parameter $R_{s,0}$ are set as constant values. Alternatively, they can be variable values.

The third parameter estimation algorithm 7' further estimates the third motor parameter which is an inductance $L_S$. Alternatively, another or no further motor parameter is estimated.

Figure 2:
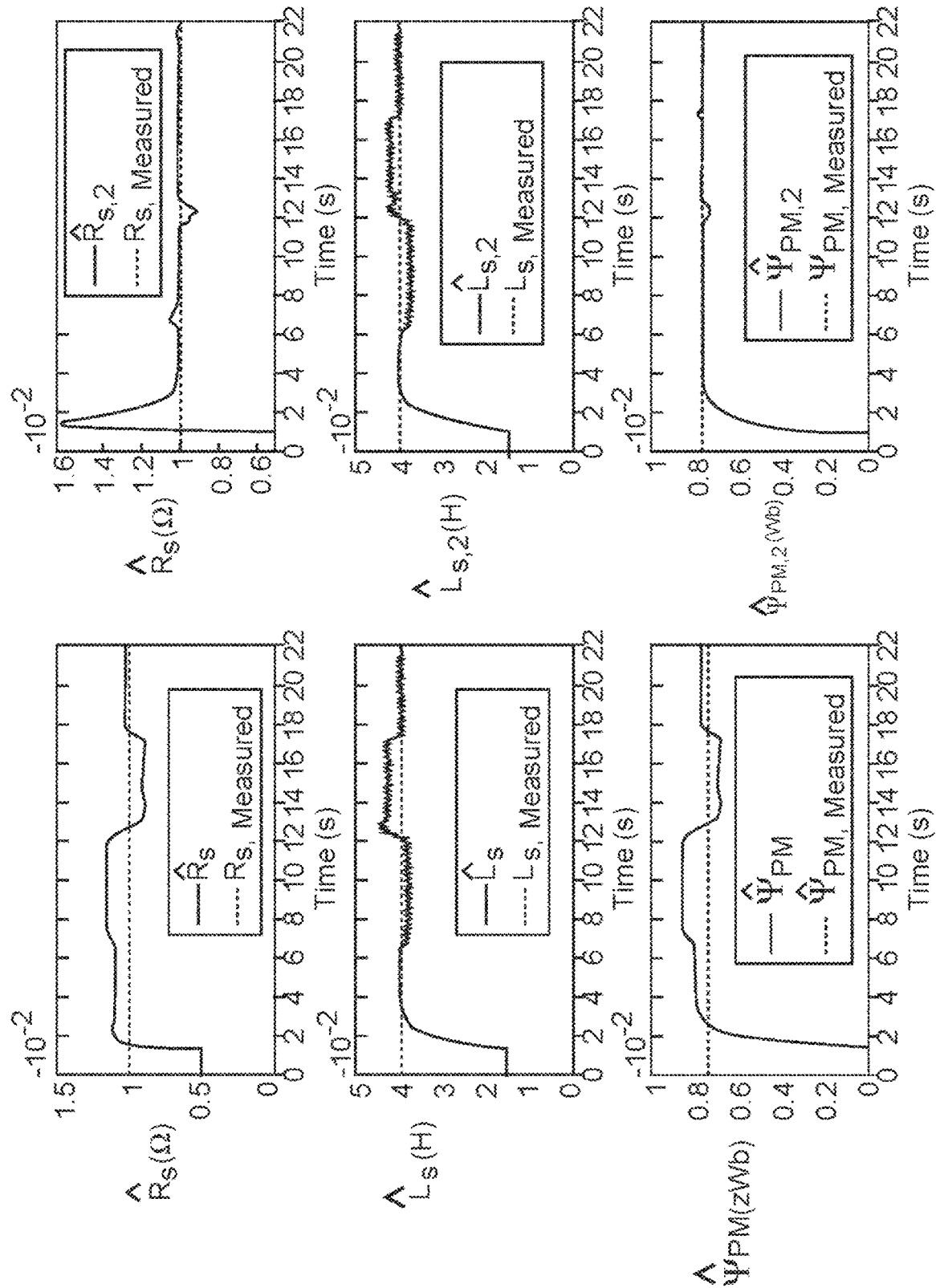
FIG. 2 shows diagrams demonstrating an efficacy of the equipment or method according to the invention.

FIG. 2 shows diagrams demonstrating an efficacy of the equipment or method according to the invention.

The upper diagrams depict the second motor parameter $R_s$, the diagrams in the middle depict the inductance $L_S$, and the lower diagrams depict the first motor parameter $\Psi_{PM}$. On the left, results of the estimation of the first estimator (2, 2') are illustrated. On the right, results of the estimation of the second estimator (3, 3') are illustrated.

The solid lines indicate estimated values and the dashed lines indicate measured values.

At 12 seconds, there is an increase in motor speed, and at 7 seconds and 18 seconds, there is an increase in the applied load torque.

In the diagrams depicting the results of the first estimator (2, 2'), a deviation of the estimated parameters due to the increase in the motor speed and in the applied load is to be seen. Moreover, as to be seen in the diagrams on the right in the results of the second estimator (3, 3), the device and the algorithm according to the invention considerably improve the result since, except a brief peak at the time of the change, the revised estimated parameters $\Psi_{PM,2}$ and $R_{s,2}$ remain unchanged during dynamic load changes.

The invention has been described in conjunction with various embodiments herein. However, other variations to the disclosed embodiments can be understood and effected by those skilled in the art in practicing the claimed invention, from a study of the drawings, the disclosure and the appended claims. Such modifications may involve other features, which are already known in the art and may be used instead of or in addition to features already described herein. In the claims, the word "comprising" does not exclude other elements or steps, and the indefinite article "a" or "an" does not exclude a plurality.

THE LIST OF REFERENCE SIGNS IS AS FOLLOWS 1 equipment for estimating a motor parameter
1' method for estimating a motor parameter
2 first estimator
2' first estimator
3 second estimator
3' second estimator
4 input interface
5 first device
5' first parameter estimation algorithm
6 second device
6' second parameter estimation algorithm
7 third device
7' third parameter estimation algorithm
8 fourth device
8' fourth parameter estimation algorithm
$\Psi_{PM}$ first motor parameter (permanent magnet flux linkage)
$\Psi_{PM,0}$ initially determined first motor parameter
$\Psi_{PM,1}$ estimated first motor parameter
$\Psi_{PM,2}$ revised estimated first motor parameter
$R_s$ second motor parameter (phase resistance)
$R_{s,0}$ initially determined second motor parameter
$R_{s,1}$ estimated second motor parameter
$R_{s,2}$ revised estimated second motor parameter
$L_S$ third motor parameter (inductance)
$u_{d,q}$ detected voltage
$i_{d,q}$ detected current
$\omega_e$ detected electrical speed
ANN artificial neuronal network
MRAC model reference adaptive control

The invention claimed is:

1. An apparatus for estimating a motor parameter, comprising:
an input interface to receive an operating parameter of an electric motor,
a first device to perform a first parameter estimation algorithm estimating an estimated first motor parameter based on the operating parameter and on an initially determined second motor parameter,
a second device to perform a second parameter estimation algorithm estimating an estimated second motor parameter based on the operating parameter and on an initially determined first motor parameter,
a third device to perform a third parameter estimation algorithm estimating a revised estimated second motor parameter based on the estimated first motor parameter and on the operating parameter, and
a fourth device to perform a fourth parameter estimation algorithm estimating a revised estimated first motor parameter based on the estimated second motor parameter and on the operating parameter.

2. The apparatus of claim 1, wherein the operating parameter includes at least one of a detected voltage, a detected current, and a detected electrical speed, the first motor parameter includes a permanent magnet flux linkage, and the second motor parameter includes a phase resistance.

3. The apparatus of claim 2, wherein the first device and the fourth device include an artificial neuronal network (ANN) model performing the first and fourth parameter estimation algorithm, and wherein the second device and the third device include a model reference adaptive control (MRAC) model performing the second and third parameter estimation algorithm.

4. The apparatus of claim 1, wherein the initially determined first motor parameter and the initially determined second motor parameter are constant values.

5. The apparatus of claim 1, wherein the third device is configured to estimate a third motor parameter.

6. The apparatus of claim 5, wherein the third motor parameter includes an inductance.

7. A method for estimating motor parameters, the method comprising:
- estimating an estimated first motor parameter based on an operating parameter and on an initially determined second motor parameter;
- estimating an estimated second motor parameter based on the operating parameter and on an initially determined first motor parameter;
- estimating a revised estimated second motor parameter based on the estimated first motor parameter and on the operating parameter; and
- estimating a revised estimated first motor parameter based on the estimated second motor parameter and on the operating parameter.

8. The method of claim 7, wherein the operating parameter includes a detected voltage, a detected current and a detected electrical speed, wherein the first motor parameter includes a phase resistance, and wherein the second motor parameter includes a permanent magnet flux linkage.

9. The method of claim 8, wherein the estimate of the estimated first motor parameter and of the revised estimated first motor parameter are performed by means of an artificial neuronal network (ANN) model, and wherein the estimate of the estimated second motor parameter and of the revised estimated second motor parameter are performed by a model reference adaptive control (MRAC) model.

10. The method of claim 7, wherein the initially determined first motor parameter and the initially determined second motor parameter are set as constant values.

11. The method of claim 7, further comprising:
- estimating a third motor parameter.

12. The method of claim 11, wherein the third motor parameter includes an inductance.

13. A non-transitory computer readable medium having a computer program, which is executable by a processor, comprising:
- a program code arrangement having program code for estimating motor parameters, by performing the following:
  - estimating an estimated first motor parameter based on an operating parameter and on an initially determined second motor parameter;
  - estimating an estimated second motor parameter based on the operating parameter and on an initially determined first motor parameter;
  - estimating a revised estimated second motor parameter based on the estimated first motor parameter and on the operating parameter; and
  - estimating a revised estimated first motor parameter based on the estimated second motor parameter and on the operating parameter.

* * * * *